*(12)* United States Patent
Arai et al.

(10) Patent No.: US 10,507,617 B2
(45) Date of Patent: Dec. 17, 2019

(54) LASER WELDED STRUCTURE, ELECTRONIC CONTROLLER AND MANUFACTURE METHOD FOR LASER WELDED STRUCTURE

(71) Applicant: HITACHI AUTOMOTIVE SYSTEMS, LTD., Hitachinaka-shi, Ibaraki (JP)

(72) Inventors: Satoshi Arai, Tokyo (JP); Shigeharu Tsunoda, Tokyo (JP); Wataru Sawada, Tokyo (JP); Masaru Kamoshida, Hitachinaka (JP); Toshikazu Shigyo, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 316 days.

(21) Appl. No.: 15/517,858

(22) PCT Filed: Sep. 29, 2015

(86) PCT No.: PCT/JP2015/077503
§ 371 (c)(1),
(2) Date: Apr. 7, 2017

(87) PCT Pub. No.: WO2016/056427
PCT Pub. Date: Apr. 14, 2016

(65) Prior Publication Data
US 2017/0326812 A1     Nov. 16, 2017

(30) Foreign Application Priority Data

Oct. 10, 2014  (JP) ................................. 2014-209352

(51) Int. Cl.
*B29C 65/16* (2006.01)
*B29C 65/82* (2006.01)
(Continued)

(52) U.S. Cl.
CPC .......... *B29C 65/1635* (2013.01); *B23K 26/21* (2015.10); *B23K 26/324* (2013.01);
(Continued)

(58) Field of Classification Search
None
See application file for complete search history.

(56) References Cited

U.S. PATENT DOCUMENTS

| 2005/0165176 A1 | 7/2005 | Matsushima et al. |
| 2008/0153957 A1* | 6/2008 | Miyamoto .......... B29C 65/1635 |
| | | 524/300 |
| 2016/0011029 A1* | 1/2016 | Arai .................. B29C 66/81267 |
| | | 156/69 |

FOREIGN PATENT DOCUMENTS

| JP | 2010-076437 A | 4/2010 |
| JP | 2011-052223 A | 3/2011 |

(Continued)

OTHER PUBLICATIONS

Japanese Office Action dated Jan. 23, 2018 for the Japanese Application No. 2016-553054.

(Continued)

*Primary Examiner* — John J Figueroa
(74) *Attorney, Agent, or Firm* — Volpe and Koenig, P.C.

(57) ABSTRACT

A laser welded structure is formed by laser welding together a resin molded body formed from a thermoplastic polymer alloy containing a crystalline resin and an amorphous resin and a metal body made of a metal. A glass transition temperature of the amorphous resin is lower than a melting start temperature of the crystalline resin.

13 Claims, 14 Drawing Sheets

(51) Int. Cl.
| | |
|---|---|
| *B29C 65/00* | (2006.01) |
| *B29C 65/44* | (2006.01) |
| *B29C 65/18* | (2006.01) |
| *B23K 26/324* | (2014.01) |
| *H05K 5/06* | (2006.01) |
| *B23K 26/21* | (2014.01) |
| *B29L 31/34* | (2006.01) |

(52) U.S. Cl.
CPC ...... *B29C 65/1606* (2013.01); *B29C 65/1616* (2013.01); *B29C 65/1629* (2013.01); *B29C 65/1638* (2013.01); *B29C 65/1654* (2013.01); *B29C 65/1661* (2013.01); *B29C 65/1677* (2013.01); *B29C 65/44* (2013.01); *B29C 65/8215* (2013.01); *B29C 65/8223* (2013.01); *B29C 66/028* (2013.01); *B29C 66/112* (2013.01); *B29C 66/114* (2013.01); *B29C 66/1122* (2013.01); *B29C 66/1142* (2013.01); *B29C 66/124* (2013.01); *B29C 66/1222* (2013.01); *B29C 66/1224* (2013.01); *B29C 66/244* (2013.01); *B29C 66/43* (2013.01); *B29C 66/5346* (2013.01); *B29C 66/71* (2013.01); *B29C 66/7212* (2013.01); *B29C 66/72143* (2013.01); *B29C 66/7392* (2013.01); *B29C 66/73115* (2013.01); *B29C 66/73117* (2013.01); *B29C 66/73161* (2013.01); *B29C 66/73521* (2013.01); *B29C 66/73771* (2013.01); *B29C 66/73775* (2013.01); *B29C 66/73921* (2013.01); *B29C 66/73941* (2013.01); *B29C 66/742* (2013.01); *B29C 66/7422* (2013.01); *B29C 66/8322* (2013.01); *B29C 66/9592* (2013.01); *H05K 5/06* (2013.01); *B29C 65/18* (2013.01); *B29C 66/026* (2013.01); *B29C 66/02245* (2013.01); *B29C 66/74283* (2013.01); *B29C 66/8122* (2013.01); *B29C 66/81267* (2013.01); *B29L 2031/3481* (2013.01)

(56) References Cited

FOREIGN PATENT DOCUMENTS

| | | |
|---|---|---|
| JP | 2012-056308 A | 3/2012 |
| JP | 2013-107325 A | 6/2013 |
| WO | 2014/123022 A1 | 8/2014 |

OTHER PUBLICATIONS

International Search Report for WO 2016/056427 A1, dated Dec. 15, 2015.

\* cited by examiner

FIG. 6
(a)
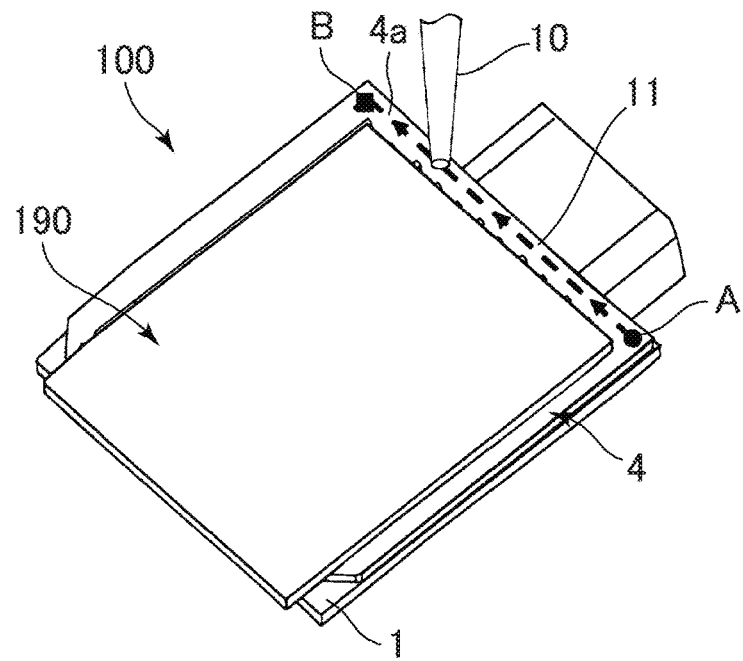
(b)
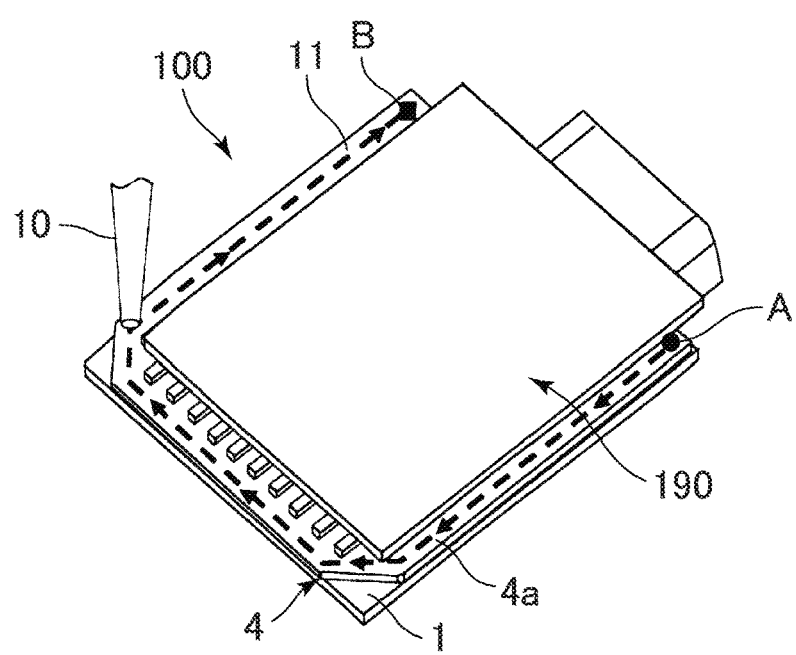

FIG. 14
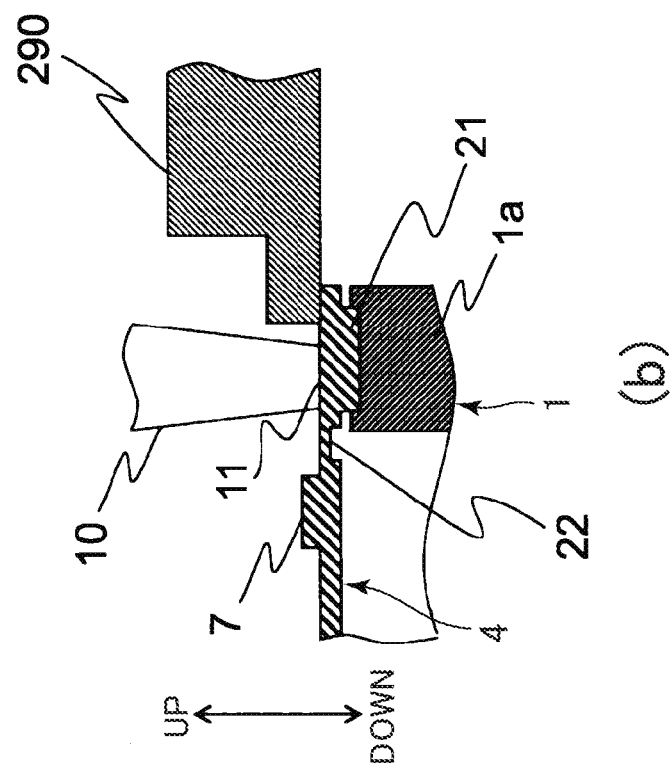
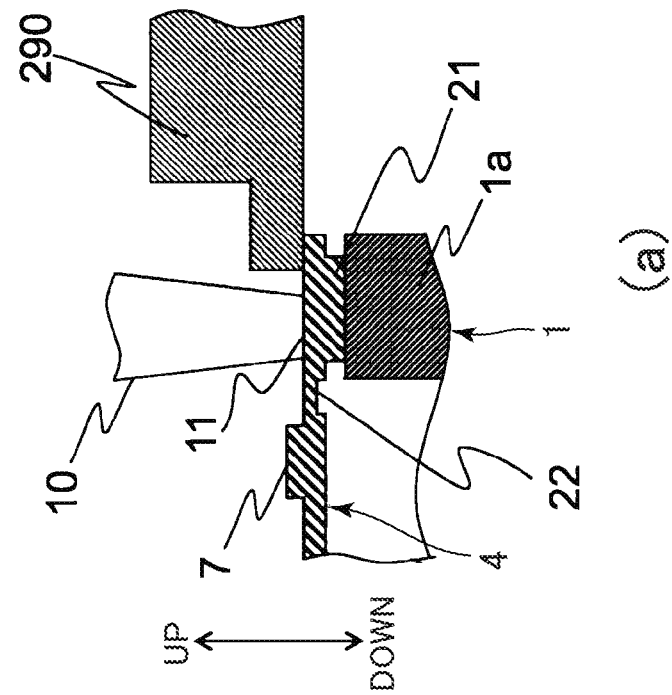

LASER WELDED STRUCTURE, ELECTRONIC CONTROLLER AND MANUFACTURE METHOD FOR LASER WELDED STRUCTURE

TECHNICAL FIELD

The present invention relates to a laser welded structure including a resin molded body and a metal body laser welded together, an electronic controller including the laser welded structure, and a manufacture method for the laser welded structure.

BACKGROUND ART

A manufacture method for composite body including a resin molded body formed from a thermoplastic resin composition and a metal body is known which includes the steps of: overlaying the resin molded body formed from the thermoplastic resin composition and the metal body on top of each other; and applying a laser beam from a metal body side so as to weld these bodies together by softening and/or melting at least a part of the resin molded body formed from the thermoplastic resin composition (see Patent Literature 1).

CITATION LIST

Patent Literature

Patent Literature 1: Japanese Unexamined Patent Application Publication No. 2010-76437

SUMMARY OF INVENTION

Technical Problem

When laser molding the resin molded body and the metal body, a laser welded portion may be decreased in joint strength if a gap between the resin molded body and the metal body is large. However, Patent Literature 1 does not give any specific description on an arrangement for preventing the joint strength degradation of the laser welded portion, which is attributable to the gap between the resin molded body and the metal body.

Solution to Problem

According to a first aspect of the present invention, a laser welded structure includes a resin molded body and a metal body made of a metal which are laser welded together, the resin molded body formed from a thermoplastic polymer alloy containing a crystalline resin and an amorphous resin, and has an arrangement wherein a glass transition temperature of the amorphous resin is lower than a melting start temperature of the crystalline resin.

According to a second aspect of the present invention, a laser welded structure includes a resin molded body and a metal body made of a metal which are laser welded together, the resin molded body formed from a thermoplastic polymer alloy containing a crystalline resin and another resin, and has an arrangement wherein a crystallization speed of the polymer alloy is lower than a crystallization speed of the crystalline resin, or a recrystallization temperature of the polymer alloy is lower than a recrystallization temperature of the crystalline resin.

According to a third aspect of the present invention, a manufacture method for laser welded structure includes: preparing a resin molded body made of a thermoplastic polymer alloy containing a crystalline resin and an amorphous resin, and a metal body made of a metal, the amorphous resin having a glass transition temperature lower than a melting start temperature of the crystalline resin; giving an oxygen function amplifying treatment to at least a portion of the resin molded body that is laser welded to the metal body; heating the resin molded body to a temperature to or above the glass transition temperature of the amorphous resin; and laser welding the resin molded body and the metal body together in a state where the resin molded body is in pressure contact with the metal body.

Advantageous Effect of Invention

The present invention can prevent the joint strength degradation of laser weld, which is attributable to the gap between the resin molded body and the metal body.

BRIEF DESCRIPTION OF DRAWINGS

FIG. 6 is a set of perspective views schematically illustrating a process of scanning a laser beam while pressing a metal base against a resin molded body by means of a pressure jig.

FIG. 14 is a set of sectional views illustrating a laser welding method for an electronic controller according to a fourth modification and a fifth modification.

DESCRIPTION OF EMBODIMENTS

The embodiments of the present invention will hereinbelow be described with reference to the accompanying drawings.

First Embodiment

Figure 1:
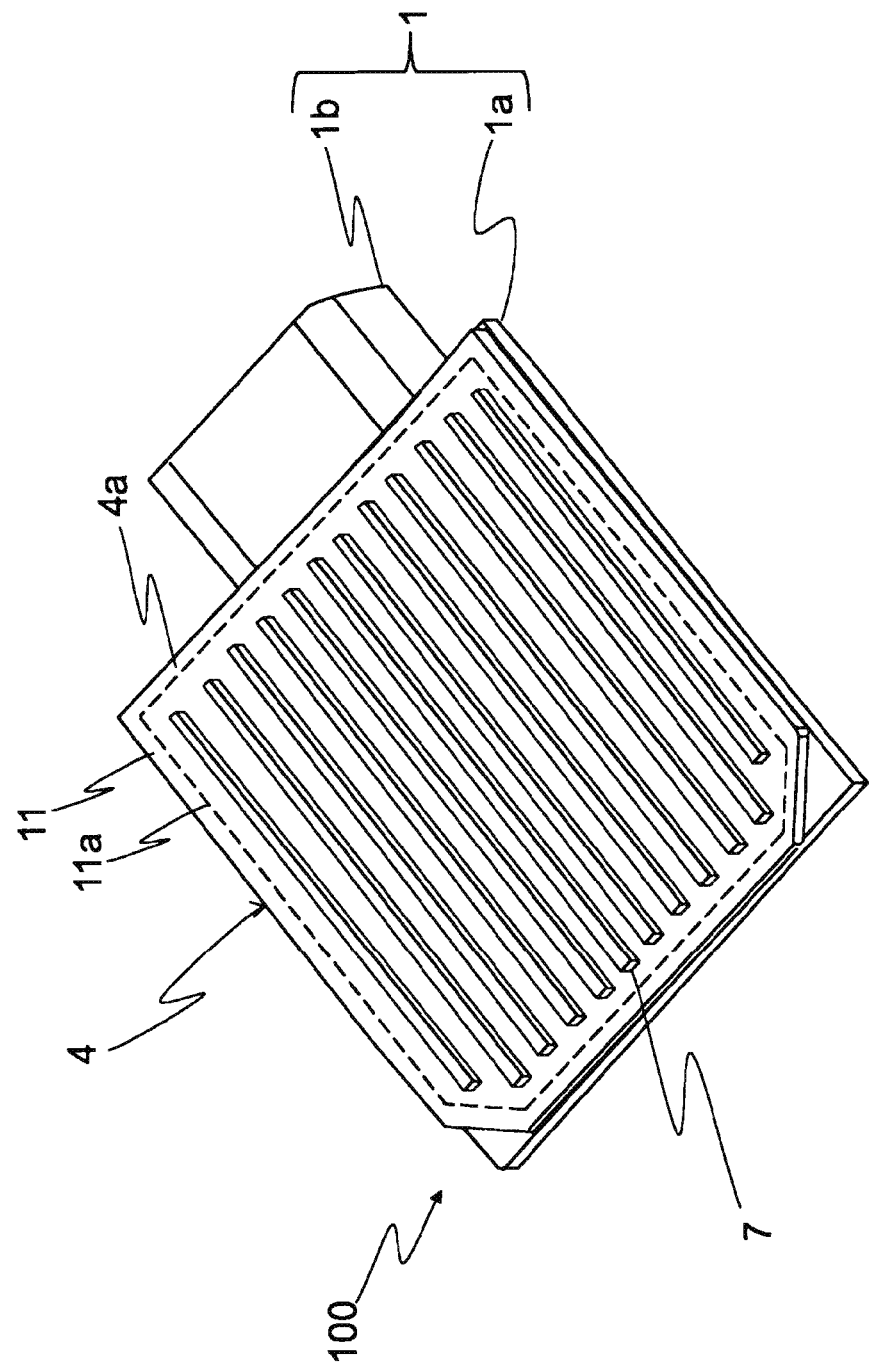
FIG. 1 is a perspective view schematically showing an electronic controller including a laser welded structure according to a first embodiment hereof.
Figure 2:
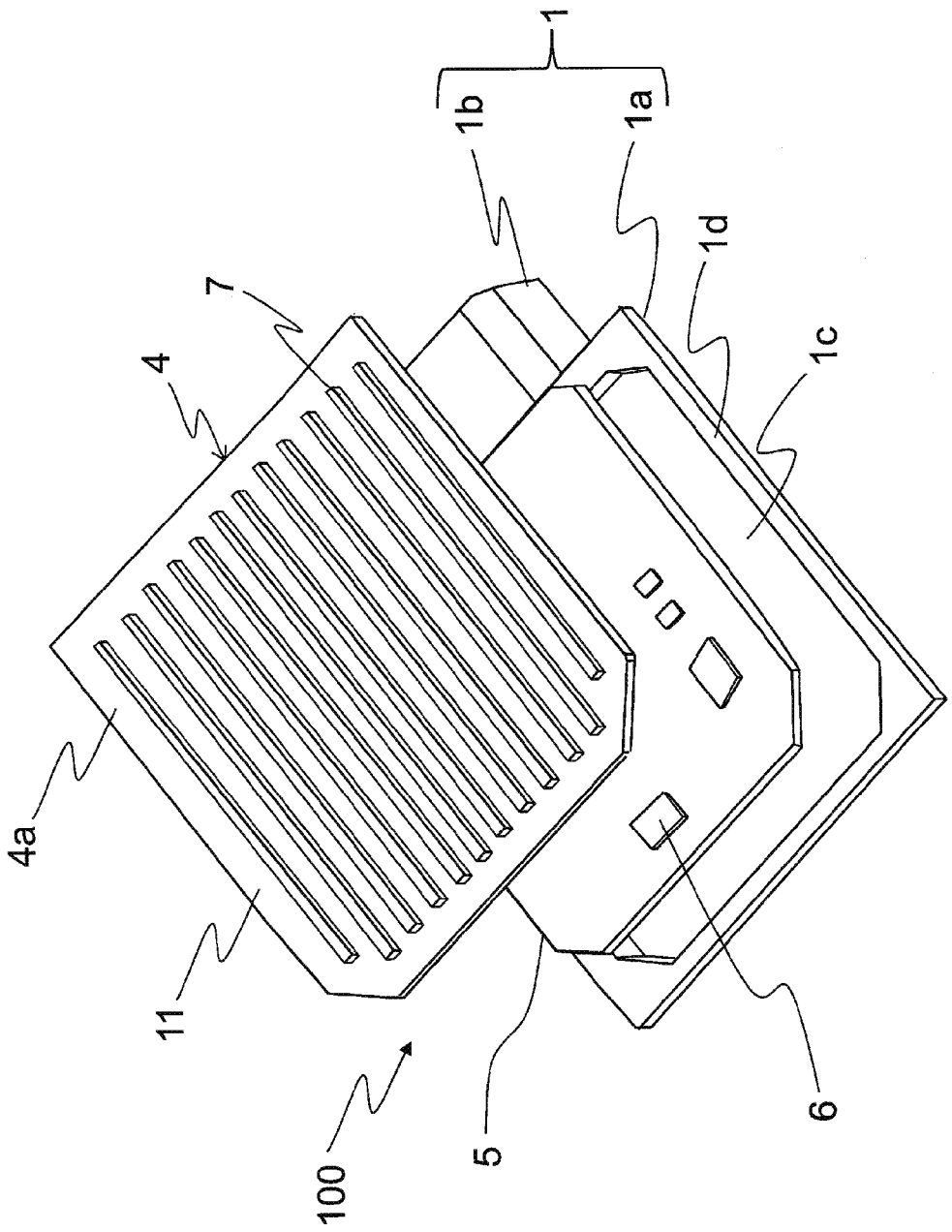
FIG. 2 is an exploded perspective view schematically showing the electronic controller.

FIG. 1 is a perspective view schematically showing an electronic controller 100 including a laser welded structure according to a first embodiment of the present invention. FIG. 2 is an exploded perspective view schematically showing the electronic controller 100. The electronic controller 100 according to this embodiment is an engine controller unit (ECU) which is installed in an automobile for electronically controlling the engine thereof. As shown in FIG. 2, the electronic controller 100 includes an engine control circuit board 5, a resin molded body 1 and a metal base 4.

The resin molded body 1 includes: a cover 1a for covering the circuit board 5 disposed on the metal base 4; and a connector 1b for signal communication between the circuit board 5 and external devices (a variety of sensors, actuator and the like). The resin molded body 1 is essentially composed of a polymer alloy which is an alloyed thermoplastic resin composition containing a thermoplastic crystalline resin and a thermoplastic amorphous resin. The resin molded body 1 is an integral molded article formed by integrally injection molding the cover 1a and the connector 1b.

The connector 1b is insert molded with terminal pins (not shown) to be electrically connected to the circuit board 5. The terminal pins (not shown) are retained by the connector 1b. The cover 1a is formed with a recess 1c in which the circuit board 5 is received. Opening edges of the recess 1c of the cover 1a define a joint surface (hereinafter, written as resin joint surface 1d) which makes contact with edges (outside circumference) of the metal base 4. The opening edges are formed in flat planes.

The metal base 4 is laser welded to the resin molded body 1 in a manner to close the recess 1c of the cover 1a. Thus, the opening of the recess 1c is closed by the metal base 4. The recess 1c and the metal base 4 jointly define an accommodation space for receiving the circuit board 5. The circuit board 5 is mounted with a plurality of electronic components 6 for engine control. The circuit board is formed with predetermined wiring patterns so as to constitute an electronic circuit portion.

The metal base 4 functions as a radiator which releases heat from the electronic components 6 of the circuit board 5 into the external air. The metal base 4 is made of die-cast aluminum and shaped like a rectangular flat plate. The metal base is formed with a plurality of cooling fins 7 arranged in parallel.

The edges (outside circumference) of the metal base 4 defines a connection portion 4a which is welded by a laser welding step to be described hereinafter. One side of the connection portion 4a of the metal base 4 defines a joint surface (hereinafter, written as metal joint surface 4d (see FIG. 7)) to make contact with the resin joint surface 1d of the resin molded body 1. The one side of the connection portion is formed in a flat plane. The other side of the connection portion 4a of the metal base 4 defines a laser irradiation face 11 irradiated with a laser beam. The laser irradiation face 11 is formed in a flat plane such as to provide for uniform laser irradiation.

A laser welded portion 11a formed by laser welding to be described hereinafter (see the broken line in FIG. 1) may preferably have a width of at least 1 mm from the viewpoint of sealing property of the laser welded portion 11a. Therefore, the width of the laser irradiation surface 11 is set to such a value as to provide the width of at least 1 mm of the laser welded portion 11a.

The connection portion 4a of the metal base 4 may preferably have a thickness of 0.5 to 2.0 mm from the viewpoint of laser welding. The surface roughness of the laser irradiation face 11 is decided in consideration of manufacture costs. In comparison with a connection portion having a small surface roughness, a connection portion having a larger surface roughness is lowered in reflectance because of an increased light scattering effect. This leads to the reduction of laser energy required for welding. The manufacture costs can be reduced by setting a laser output for laser welding to a lower level. Further, a manufacturing process can be shortened by setting a laser beam scanning speed to a high value. The surface roughness of the metal base 4 can be increased by blasting treatment or chemical treatment. For the purpose of increasing absorption rate, the metal base may also be subjected to an alumite treatment in addition to the surface roughening treatment.

Figure 3:
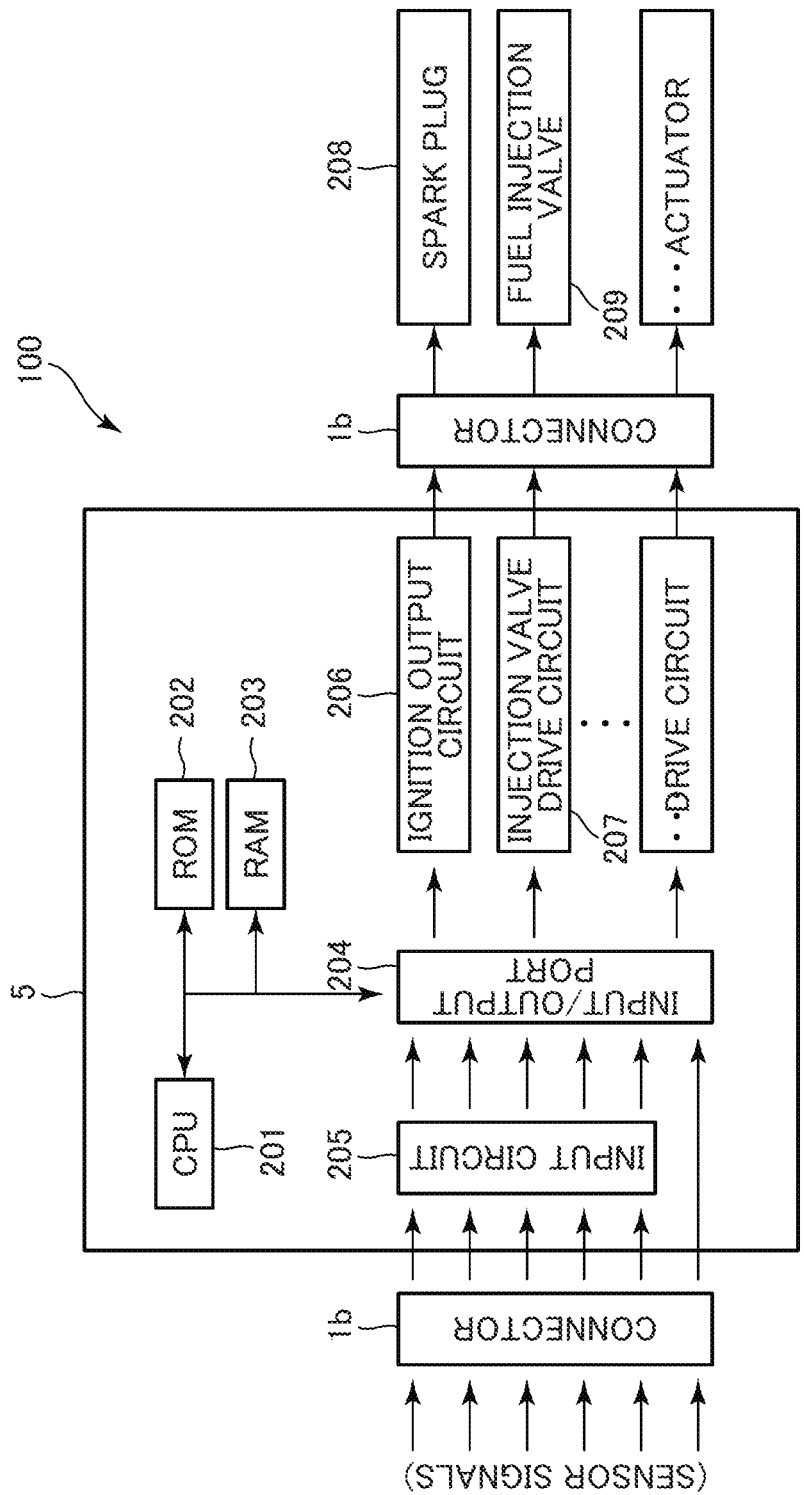
FIG. 3 is a functional block diagram of the electronic controller.

FIG. 3 is a functional block diagram of the electronic controller 100. As shown in FIG. 3, the circuit board 5 includes: mutually bus-connected CPU 201, ROM 202, RAM 203 and input/output port 204; an input circuit 205; and drive circuits for controlling the operations of various actuators.

The input circuit 205 receives detection signals from various sensors such as crank angle sensor, and water temperature sensor via terminals of the connector 1b. The drive circuits include: an ignition output circuit 206 for outputting a drive control signal in a predetermined timing to a spark plug 208 via a terminal of the connector 1b; and an injection valve drive circuit 207 for outputting a drive control signal in a predetermined timing to a fuel injection valve 209 via a terminal of the connector 1b.

Now, description is made on a method for manufacturing the electronic controller 100 including the laser welded structure.

Figure 4:
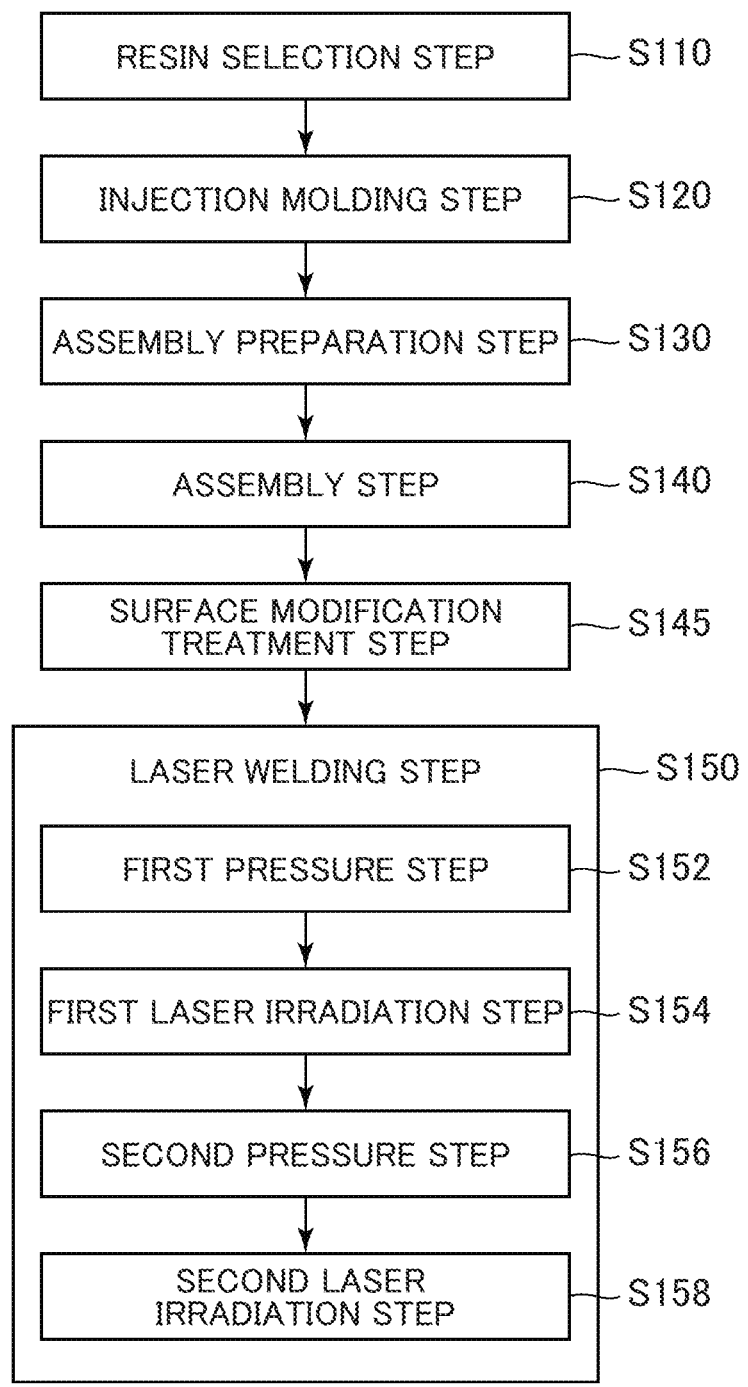
FIG. 4 is a flow chart for illustrating the steps of manufacturing the electronic controller.

FIG. 4 is a flow chart for illustrating the steps of manufacturing the electronic controller 100. The method for manufacturing the electronic controller 100 includes: a resin selection step S110; an injection molding step S120; an assembly preparation step S130; an assembly step S140; a surface modification treatment step S145; and a laser welding step S150.

Resin Selection Step

In the resin selection step S110, a crystalline resin and an amorphous resin to be alloyed therewith. In the selection, the crystalline resin and the amorphous resin are each selected such as to satisfy the following selection condition. The selected crystalline resin and amorphous resin are alloyed and formed into polymer alloy pellet.

Figure 5:
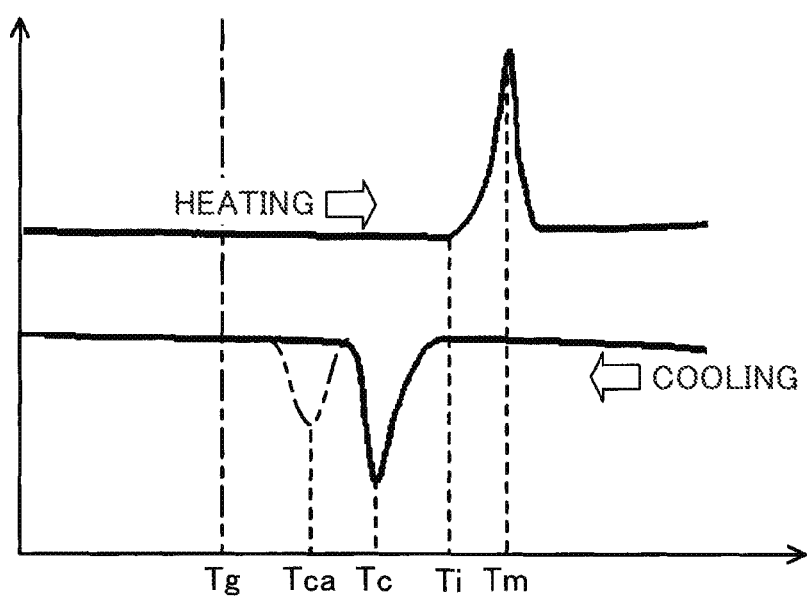
FIG. 5 is a chart illustrating a selection method of a crystalline resin and an amorphous resin.

Selection Condition: Glass transition temperature Tg of amorphous resin<Melting start temperature Ti of crystalline resin FIG. 5 is a chart illustrating a selection method for a crystalline resin and an amorphous resin. In FIG. 5, the solid curve line is a DSC curve indicating the measurement result of differential scanning calorimetry (DSC) of the crystalline resin. In FIG. 5, the curved two-dot chain line is a DSC curve indicating the measurement result of a polymer alloy based on a crystalline resin alloyed with an amorphous resin as an alloying material. The DSC curve is obtained near recrystallization temperature Tca. In FIG. 5, the straight dot-dash line indicates the glass transition temperature Tg of the amorphous resin.

As shown in FIG. 5, the melting start temperature Ti and the melting point Tm of the crystalline resin, and the recrystallization temperatures Tc, Tca can be determined using a known differential scanning calorimeter. The melting start temperature Ti means a temperature at which melt-induced endotherm starts on the basis of the DSC curve during heating. In conformity with JISK7121, for example, the melting start temperature can be defined as the melting start temperature extrapolated from the DSC curve obtained by differential scanning calorimetry. The recrystallization temperature means a temperature at an exothermic peak of the DSC curve during cooling.

Considering that the electronic controller 100 is installed in an engine room of an automobile, any one of polybutylene terephthalate (PBT), polyamide 6 (PA6), polyamide 66 (PA66), polyamide 6T (PA6T), polyamide 9T (PA9T) and polyphenylene sulfide (PPS) may preferably be selected as the crystalline resin in terms of heat resistance and chemical resistance.

A favorable amorphous resin may be selected from the group of polystyrene (PS), acrylonitrile styrene (AS), polycarbonate (PC), acrylonitrile-butadiene-styrene copolymer (ABS), poly (methyl methacrylate) (PMMA) and cycloolefin polymer (COP). It is noted that polystyrene (PS) also includes high impact styrene (HIPS).

Injection Molding Step

In the injection molding step S120 shown in FIG. 4, the pelletized polymer alloy obtained in the resin selection step 110 is heat melted, and the resultant molten polymer alloy is injection molded into the resin molded body 1 by means of an injection molding machine (not shown). A nozzle of the injection molding machine is set to a position corresponding to the center of the cover 1a, for example. The polymer alloy ejected from an injection orifice of the nozzle spreads around from the center so that the cover 1a and the connector 1b are formed in one piece.

Assembly Preparation Step

In the assembly preparation step S130, the resin molded body 1, the circuit board 5 mounted with the electronic components 6, and the metal base 4 are prepared.

Assembly Step

In the assembly step S140, the circuit board 5 is placed in the recess 1c of the resin molded body 1. The terminal pins of the connector 1b are soldered to the circuit board 5 by spot flow soldering (local soldering) so as to electrically interconnect the terminal pins and the circuit board. The circuit board 5 is fixed to the resin molded body 1 by means of an adhesive, thermal caulking, screws or the like. in a case where the adhesive is used, an ultraviolet curing adhesive or a two-part adhesive that cures at room temperatures may preferably be used for fixing these elements because a process time can be shortened.

In order to permit the metal base 4 to release heat efficiently, a heat release material may be applied to the metal base 4 in a manner that the heat release material is interposed between the metal base 4 and the circuit board 5. Examples of a usable heat release material include epoxy-based and silicone-based thermosetting resins. In this case, the heat release material can be cured by heat generated during a laser welding process to be described hereinafter.

Surface Modification Treatment Step

In the surface modification treatment step S145, an atmospheric pressure plasma treatment is given to the joint surfaces of the resin molded body 1 and the metal base 4. In the surface modification treatment step S145, plasma particle is generated at atmospheric pressures and released toward the resin joint surface id of the resin molded body 1 and the metal joint surface 4d of the metal base 4. Thus, an oxygen function is generated and amplified at the resin joint surface 1d, which is increased in surface energy. Further, when the atmospheric pressure plasma treatment is given to the metal joint surface 4d, the surface is cleaned and formed with a strong oxide film so that the metal joint surface is increased in the surface energy. It is noted that the surface modification treatment step may be performed at any time frame between the injection molding step and the welding step.

Laser Welding Step

In the laser welding step S150, the irradiation of laser beam 10 involves a fear that if a reflected laser beam from the surface of the metal base 4 becomes incident on a laser beam source, the laser beam source may be deteriorated. Therefore, the laser beam 10 is obliquely irradiated in order to prevent the reflected be laser beam 10 from becoming incident on the laser beam source. Accordingly, the laser irradiation is performed in two steps. A process to give the laser irradiation in two steps is described as below.

Figure 7:
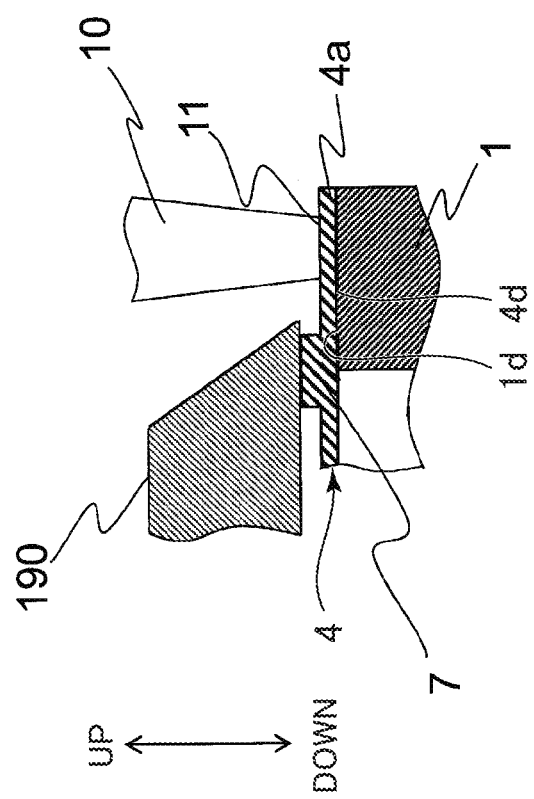
FIG. 7 is a sectional view schematically showing a state where the metal base is pressed against the resin molded body by means of the pressure jig.

The laser welding step S150 includes: a first pressure step 5152; a first laser irradiation step S154; a second pressure step 5156; and a second laser irradiation step S158. FIG. 6 is a set of perspective views schematically illustrating a process of scanning the laser beam 10 in a state where the metal base 4 is pressed against the resin molded body 1 by means of a pressure jig 190. In FIG. 6, the broken line schematically shows the trajectory of the laser beam 10. FIG. 7 is a sectional view schematically showing the state where the metal base 4 is pressed against the resin molded body 1 by means of the pressure jig 190.

In the laser welding step S150, the resin molded body 1 is first placed on a work table (not shown) with the resin joint surface 1d thereof facing up. The resin molded body 1 is fixed to the work table. The metal base 4 is placed on the resin molded body 1 in a manner that the metal joint surface 4d of the metal base 4 abuts on the resin joint surface 1d of the resin molded body 1. The pressure jig 190 having a flat pressure surface is prepared.

First Pressure Step

In the first pressure step S152, the pressure jig 190 is so positioned as to locate an edge thereof in an adjoining relation with a laser irradiation face 11 conforming to one side of the rectangular metal base 4, as shown in FIG. 6(a) and FIG. 7 The pressure jig 190 is applied from above to the metal base 4 so as to press the metal base 4 downward. Thus, the metal joint surface 4d of the metal base 4 and the resin joint surface 1d of the resin molded body 1 are pressed against each other. It is noted that the metal joint surface 4d of the metal base 4 and the resin joint surface 1d of the resin molded body 1 are each formed with fine surface irregularities. Therefore, the phrase "the metal joint surface 4d and the resin joint surface ld are pressed against each other" does not necessarily mean that the metal joint surface 4d and the resin joint surface 1d are pressed against each other on the overall areas thereof but includes a fact that the metal joint surface 4d and the resin joint surface 1d partially forma gap therebetween. As the contact area of the pressure jig 190 against the metal base 4 increases, the warpage of the metal base 4 and the decease of adhesion between the metal base 4 and the resin molded body 1 can be more positively prevented.

First Laser irradiation Step

The first laser irradiation step S154 is performed in the state where the resin molded body 1 and the metal base 4 are pressed against each other by the pressure jig 190. In the first laser irradiation step S154, as shown in FIG. 6(a) and FIG. 7, the laser irradiation face 11 conforming to the one side of the rectangular metal base 4 is irradiated with the laser beam 10. As schematically indicated by the broken line in FIG. 6(a), the laser beam 10 is linearly scanned from a start point A to an end point B so as to weld together the metal joint surface 4d and the resin joint surface 1d.

Second Pressure Step

In the second pressure step S156, the pressure jig 190 is so positioned as to locate edges thereof in an adjoining relation with the laser irradiation face 11 conforming to three sides of the rectangular metal base 4, as shown in FIG. 6(b) and FIG. 7. The pressure jig 190 is applied from above to the metal base 4 so as to press the metal base 4 downward. Thus, the metal joint surface 4d of the metal base 4 and the resin joint surface 1d of the resin molded body 1 are pressed against each other.

Second Laser Irradiation Step

The second laser irradiation step S158 is performed in the state where the resin molded body 1 and the metal base 4 are pressed against each other by the pressure jig 190. In the second laser irradiation step S158, as shown in FIG. 6(b) and FIG. 7, the laser irradiation face 11 conforming to the three sides of the rectangular metal base 4 is irradiated with the laser beam 10. As schematically indicated by the broken line in FIG. 6(b), the laser beam 10 is scanned from the start point A to the end point B on an open-ended rectangular trajectory so as to weld together the metal joint surface 4d and the resin joint surface 1d.

The resin molded body 1 and the metal base 4 are welded together and thus is completed the electronic controller 100. As schematically indicated by the broken line in FIG. 1, the laser welded portion 11a is formed by scanning the laser beam 10 on the whole circumference of the laser irradiation face 11 which defines a blank rectangle shape, conforming to the four sides of the metal base 4. As a result, the accommodation space hosing the circuit board 5 is sealed with the laser welded portion 11a.

The start point A and the end point B tend to be increased in heat input by the laser beam 10 because the start point A and the end point B are subjected to the irradiation in both the first laser irradiation step S154 and the second laser irradiation step S158. To uniformize the heat input, therefore, the start point A and the end point B in the first laser irradiation step S154 and the start point A and the end point B in the second laser irradiation step S158 may be somewhat deviated from each other, respectively.

In the laser welding step S150, the sequence of steps including: the first pressure step S152→the first laser irradiation step S154 →the second pressure step S156→the second laser irradiation step S158 may be repeated in cycles.

Evaluation of Joint Strength

What is important to an electronic controller subjected to vibrations and impacts, such as the electronic controller 100 mounted in the automobile, is to enhance the joint strength between the resin molded body 1 and the metal base 4. By the way, Patent Literature 1 teaches that in the light of requisite characteristics including moldability, toughness, low warpage property of molded body and the like, it is practically favorable to mix the PBT resin with at least one selected from the group of polycarbonate resin, acrylonitrile-styrene copolymer, polyphenylene oxide, styrene resin, acrylic resin, polyether sulfone, polyarylate, and polyethylene terephthalate (see Patent Literature 1, paragraph [0104]).

However, Patent Literature 1 does not give any description on an arrangement for preventing the joint strength degradation attributable to the gap between the resin molded body and the metal base. The patent literature does not make any statement about a fact that the resin used as the alloying material contributes to the enhanced joint strength of the laser weld of the resin molded body and the metal body. The present inventors focused attention on an effective resin property for preventing the joint strength degradation attributable to the gap between the resin molded body and the metal body. The present inventors have found that the resin used as the alloying material has a significant effect on the joint strength of the laser weld with the metal body. Through intensive studies, the present inventors have selected crystalline resins and amorphous resins to satisfy the above-described selection condition and have found that the alloyed resin can increase in the joint strength of the laser weld with the metal body.

For evaluation of the joint strength of the laser weld of the resin molded body 1 and metal base 4 which constitute the above-described electronic controller 100, a laser welded body was fabricated by laser welding together a resin piece TPp made of an alloyed resin composition and a metal piece TPm. The laser welded body was subjected to a joint strength test. Further, a laser welded body for comparison purpose was fabricated by laser welding together a resin piece TPp made of an unalloyed resin composition and a metal piece TPm, and subjected to the same joint strength test.

Figure 8:
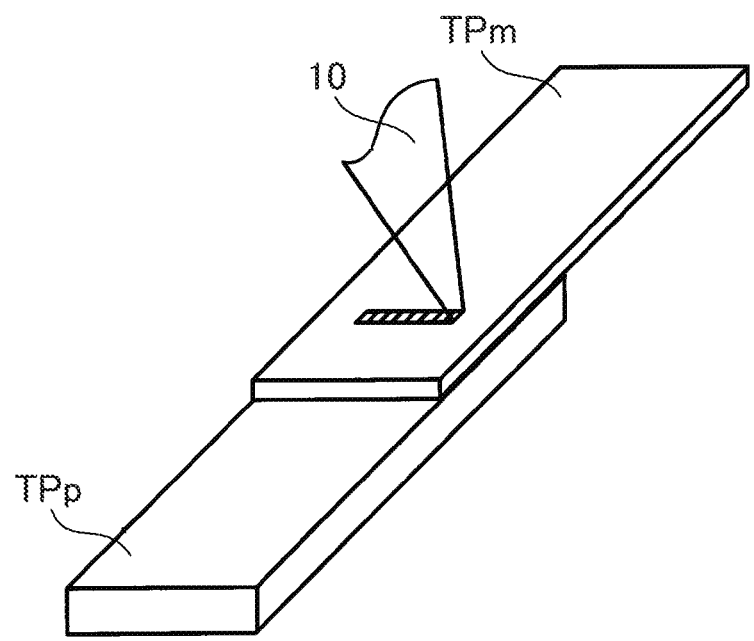
FIG. 8 is a diagram illustrating how to laser weld a resin piece and a metal piece together.

FIG. 8 is a diagram illustrating how to laser weld a resin piece TPp and a metal piece TPm together. As shown in FIG. 8, each of the resin piece TPp and the metal piece TPm is a rectangular plate-like test piece. In the laser welding, the resin piece TPp and the metal piece TPm are overlaid on top of each other at a 20 mm square region, to which a pressure of 0.3 MPa is externally applied so as to press these pieces against each other. With the resin piece TPp and the metal piece TPm pressed against each other, the laser beam is applied to the metal piece TPm so as to laser weld the resin piece TPp and the metal piece TPm together. The maximum gap between the resin piece TPp and the metal piece TPm is on the order of 20 μm.

A semiconductor laser apparatus was used as the laser apparatus. Laser irradiation conditions include: an output of 350 W; a laser scan speed of 3 mm/s; and a scan length of 10 mm. A spot size of the laser beam applied to the metal piece TPm is ϕ0.6 mm. Two types of resin pieces TPp were used which include one previously subjected to the atmospheric pressure plasma treatment and one not subjected to the atmospheric pressure plasma treatment.

The metal piece TPm was formed of an aluminum alloy sheet JIS A5052. There were used two types of metal pieces TPm, which have a surface roughness (center-line average roughness) Ra of 0.3 μm and 2.0 μm, respectively.

The following resin pieces TPp were used which include a resin piece for comparison, and first to fourth resin pieces.

Resin Piece for Comparison

The resin piece TPp is formed of a PBT resin. The PBT resin is added with about 30 wt % of glass fiber.

First Resin Piece

A resin piece TPp is formed of a polymer alloy including a PBT resin as a base material, which is alloyed with polystyrene (hereinafter written as "PS") as an alloying material. A mixing ratio of the PBT resin and the PS resin contained in the polymer alloy is about 70% of PBT resin and about 30% of PS resin. The polymer alloy is added with about 30 wt % of Glass fiber.

Second Resin Piece

A resin piece TPp is formed of a polymer alloy including a PBT resin as a base material, which is alloyed with acrylonitrile styrene (hereinafter written as "AS") as an alloying material. A mixing ratio of the PBT resin and the AS resin contained in the polymer alloy is about 80% of PBT resin and about 20% of AS resin. The polymer alloy is added with about 30 wt % of glass fiber.

Third Resin Piece

A resin piece TPp is formed of a polymer alloy including a PBT resin as a base material, which is alloyed with polycarbonate (hereinafter written as "PC") as an alloying material. A mixing ratio of the PBT resin and the PC resin contained in the polymer alloy is about 80% of PBT resin and about 20% of PC resin. The polymer alloy is added with about 40 wt % of glass fiber.

Fourth Resin Piece

A resin piece TPp is formed of a polymer alloy including a PBT resin as a base material, which is alloyed with polyethylene terephthalate (hereinafter written as "PET") as an alloying material. A mixing ratio of the PBT resin and the PET resin contained in the polymer alloy is about 70% of PBT resin and about 30% of PET resin. The polymer alloy is added with about 30 wt % of glass fiber.

The first to third resin pieces employ amorphous resins as the alloying material while the fourth resin piece employs a crystalline resin as the alloying material. Each of the resin piece for comparison and the first to fourth resin pieces contains a different additive within an amount of small percent.

Test Results

Figure 9:
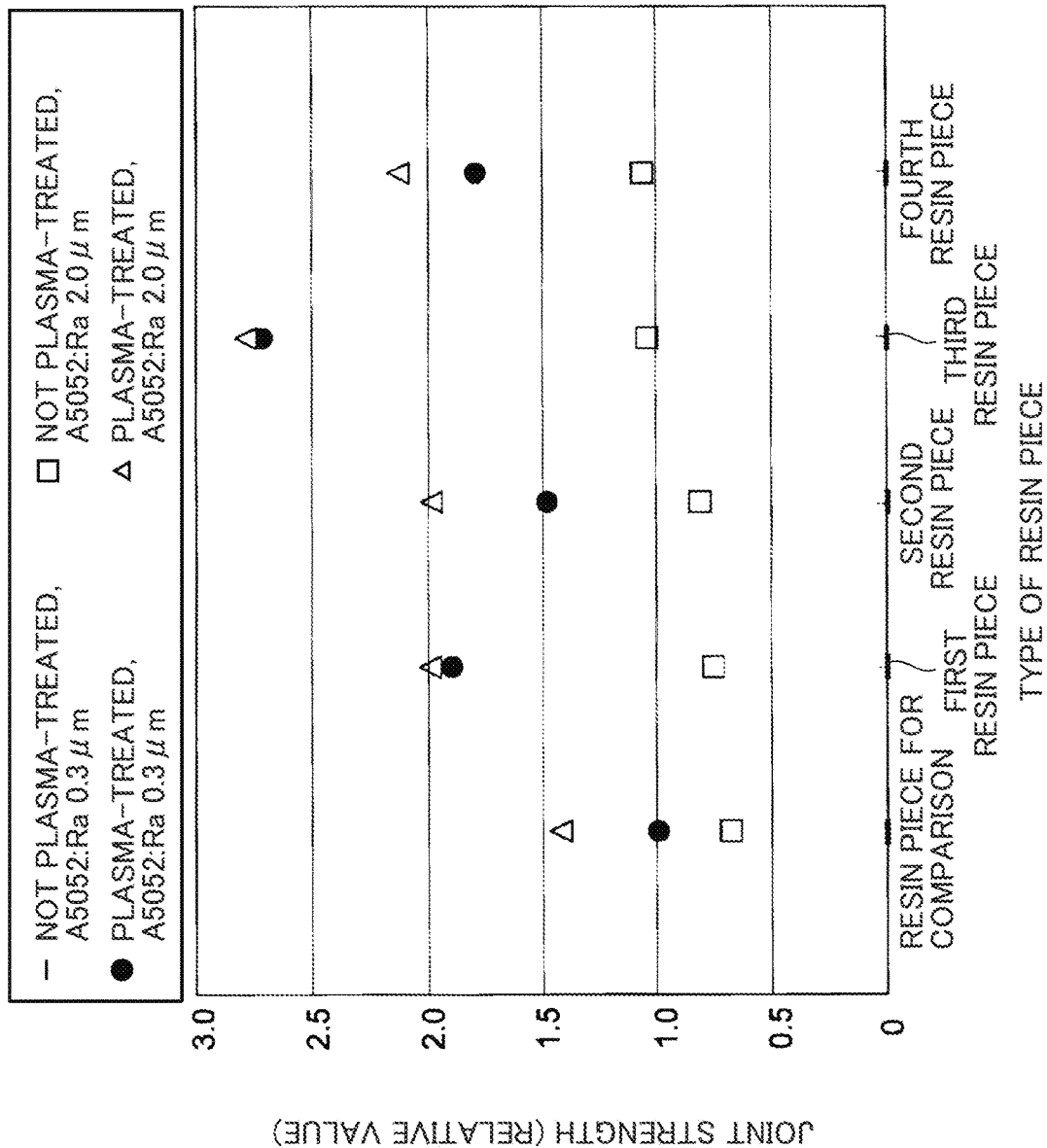
FIG. 9 is a chart showing the results of strength evaluation.

FIG. 9 is a chart showing the results of strength evaluation. The strength evaluation results shown in FIG. 9 indicate the Mint strengths of the laser welded bodies in terms of numerical values (or relative values) based on a joint strength of a laser welded body defined as 1 (or reference value), which laser welded body is made of the resin piece for comparison that was plasma treated before laser welding and a metal piece PTm having an average roughness Ra of 0.3 μm at the joint surface. While the resin piece for comparison, and the first, second and fourth resin pieces each contain the glass fiber in an amount of about 30 wt %, the third resin piece contains the glass fiber in an amount of about 40 wt %. However, a difference in the additive amount of glass fiber hardly affects the laser joint strength.

Strength Evaluation of Laser Welded Bodies including Not-plasma-treated Resin Piece TPp and Metal Piece TPm The laser welded bodies were each formed by laser welding together each of the resin piece for comparison and the first to fourth resin pieces and the metal piece TPm having the average roughness Ra of 0.3 μm at the joint surface thereof. As shown in FIG. 9, all the laser welded bodies have problems. Some suffered boundary separation when the welded body temperature returns to a room temperature while others suffered welding failure even though irradiated with the laser beam 10.

In the case of the metal piece TPm having an average roughness of 2.0 μm at the joint surface, all the laser welded bodies employing the first to fourth resin pieces were more improved in the joint strength than the laser welded body employing the resin piece for comparison. The laser welded bodies employing the third resin piece and the fourth resin piece, in particular, were notably increased in the joint strength and have high percentages of cohesion failure.

Strength Evaluation of Laser Welded Body including Plasma-treated Resin Piece TPp and Metal Piece TPm In the case of the metal piece TPm having the average roughness Ra of 0.3 μm at the joint surface, all the laser welded bodies employing the first to fourth resin pieces were more improved in the joint strength than the laser welded body employing the resin piece for comparison. The laser welded body employing the third resin piece, in particular, was dramatically increased in the joint strength and had a higher percentage of cohesion failure than the other welded bodies.

In the case of the metal piece TPm having the average roughness Ra of 2.0 μm at the joint surface, all the laser welded bodies employing the first to fourth resin pieces were more improved in the joint strength than the laser welded body employing the resin piece for comparison. The laser welded body employing the third resin piece, in particular, was dramatically increased in the joint strength and had a higher percentage of cohesion failure than the other welded bodies.

As described above, it was quantitatively demonstrated that the laser welded bodies including the resin pieces TPp made of the alloyed PBT resin or polymer alloy and the metal piece TPm had higher joint strength than the laser welded bodies including the resin pieces TPp made of the unalloyed PBT resin and the metal piece TPm.

Figure 10:
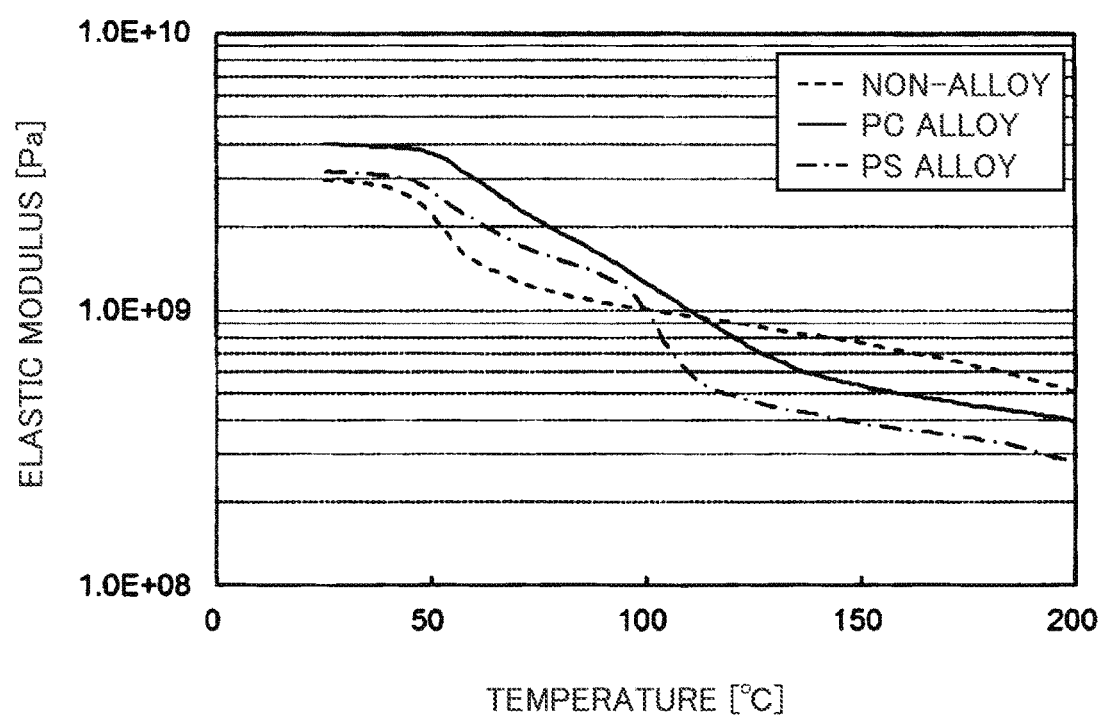
FIG. 10 is a graph showing temperature characteristics of the elastic modulus of polymer alloys.

FIG. 10 is a graph showing temperature characteristics of the elastic modulus of polymer alloys. In FIG. 10, the abscissa is the temperature and the ordinate is the elastic modulus. The broken line indicates a temperature characteristic of the elastic modulus of an unalloyed PBT resin (written as non-alloy in the figure). The solid line indicates a temperature characteristic of the elastic modulus of a polymer alloy (written as PC alloy in the figure) prepared by incorporating a PC resin as the alloying material into a PBT resin as the base material. The dot-dash line indicates a temperature characteristic of the elastic modulus of a polymer alloy (written as PS alloy in the figure) prepared by incorporating a PS resin as the alloying material into the PBT resin as the base material.

As shown in FIG. 10, the elastic modulus decreases with a rise in temperature. The elastic moduli of the polymer alloys (PC alloy and PS alloy) are higher than that of the PBT resin (non-alloy) in a low temperature region, while the elastic moduli of the polymer alloys (PC alloy and PS alloy) are lower than that of the PBT resin (non-alloy) in a high temperature region.

When the temperature of the resin piece TPp rises during the laser beam irradiation in the laser welding step, decline of the elastic modulus of the resin piece starts with the rise in temperature, namely the resin piece starts to soften. As shown in FIG. 10, the polymer alloy resin piece TPp has a lower elastic modulus than the non-alloy resin piece TPp in the high temperature region. In the laser welding, therefore, the amount of gap between the resin piece TPp and the metal piece TPm is more reduced in the case of the polymer alloy resin piece TPp. Namely, the polymer alloy resin piece TPp forms a much smaller gap with the metal piece TPm in the laser welding than the non-alloy resin piece TPp. Consequently, the polymer alloy resin piece TPp achieves the improved joint strength.

Further, it was found from the test results shown in FIG. 9 that the modification effect of the plasma treated amorphous resin provided an extremely large effect of improving the joint strength of the laser welded body including the resin piece TPp made of the plasma treated polymer alloy and the metal piece TPm.

It was also found that the larger the surface roughness of the joint surface of the metal piece TPm welded with the resin piece TPp, the more improved was the joint strength. In comparison with the case of small surface roughness, the larger surface roughness provides the larger area of contact between the resin piece TPp and the metal piece TPm, which contributes to the improvement of joint strength.

In the case where the metal piece TPm was increased in the surface roughness, the resin pieces TPp (the third resin piece and the fourth resin piece) which incorporate resins as the alloying material, such as the PC resin and the PET resin containing the same ester as the PBT resin, had a significant effect to improve the joint strength. This is probably because the lower the crystallization speed, the greater the effect to improve the adhesion. In order to improve the joint strength by lowering the crystallization speed, it is also effective to use a PBT copolymer in combination in such an amount as not to impair the moldability of the resin. However, the moldability is significantly impaired if a simple PBT copolymer is alloyed with the amorphous resin. It is invariably important to use the PBT copolymer in combination.

The above evaluation of joint strength concerns the case where the metal sheet JIS A5052 was used as the metal piece TPm. In cases where a metal sheet JIS ADC12 (die-cast aluminum) and galvanized steel sheet were used as the metal piece TPm, as well, it was confirmed, just as in FIG. 9, that the joint strength could be improved by alloying the PET resin although the laser irradiation conditions and the thickness of the metal piece TPm were different.

Evaluation of Joint Strength in Electronic Controllers

The joint strength evaluation was performed not only on the above laser welded bodies of the resin piece TPp and the metal piece TPm, but also on the electronic controllers 100. In the electronic controller 100 of the embodiment, the polymer alloy constituting the resin molded body 1 contained a PET resin as the base material, which was alloyed by incorporating about 20% of PC resin and was added with about 40 wt % of glass fiber.

In an electronic controller according to a comparative example, a PET resin (non-alloy) constituting the resin molded body 1 was added with about 30 wt % of glass fiber.

The electronic controller 100 of the embodiment and the electronic controller of the comparative example each employed the metal base 4 made of the same material and had the same configuration. The metal base employed JIS ADC12 (die-cast aluminum).

In each of the electronic controller 100 of the embodiment and the electronic controller of the comparative example, the resin joint surface 1$d$ of the resin molded boy 1 and the metal joint surface 4$d$ of the metal base 4 were subjected to the atmospheric pressure plasma treatment before laser irradiation. The same laser welding conditions were applied to the electronic controllers of the embodiment and the comparative example, where the resin molded body 1 and the metal base 4 were laser welded.

The resin molded body 1 and the metal base 4 were laser welded together in both the electronic controller 100 of the embodiment and the electronic controller of the comparative example.

Destruction Test

When a force was externally applied so as to tear the resin molded body 1 and the metal base 4 of the electronic controller of the comparative example from each other, an interface between the resin molded body 1 and the metal base 4 was broken but any destruction of the resin molded body 1 itself was not observed. On the other hand, when the force was externally applied so as to tear the resin molded body 1 and the metal base 4 of the electronic controller 100 of the embodiment from each other, the resin molded body 1 itself was broken but any destruction of the interface between the resin molded body 1 and the metal base 4 was not observed. In the destruction test, the force required to destruct the electronic controller of the embodiment was greater than the force required to destruct the electronic controller of the comparative example. It is thus confirmed that the embodiment has achieved a greater improvement of the laser joint strength than the comparative example. Since the maximum gap amount at that time was on the order of 40 µm, the use of the resin alloy is considered to be notably effective to improve the joint strength.

Sinking Airtight Test

The electronic controller of the comparative example was sunk in water. The resin molded body 1 was formed with a hole, through which a pressure of about 0.3 MPa was applied to the accommodation space therein. Then, the leakage of air bubbles from the laser welded portion 11$a$ was observed. On the other hand, the electronic controller 100 of the embodiment was sunk in water. The resin molded body 1 was formed with a hole, through which a pressure of about 0.3 MPa was applied to the accommodation space therein. The leakage of air bubbles from the laser welded portion 11$a$ was not observed. Namely, it was confirmed that the airtightness of the accommodation space by means of the laser welded portion 11$a$ was more improved in the embodiment than in the comparative example.

According to the above-described first embodiment, the following working effects can be obtained.

(1) The electronic controller 100 was fabricated by laser welding the resin molded body 1 made of the thermoplastic polymer alloy containing the crystalline resin and the amorphous resin, and the metal base 4 made of metal. The crystalline resin and the amorphous resin were selected such that the glass transition temperature Tg of the amorphous resin is lower than the melting start temperature Ti of the crystalline resin. Even though the amount of gap between the resin joint surface 1$d$ and the metal joint surface 4$d$ varies in the overall laser scan region, the amount of gap between the resin joint surface id and the metal joint surface 4$d$ is effectively reduced by the heat-induced softening (decrease in elastic modulus) of the resin molded body 1 during the laser irradiation. Therefore, the electronic controller can ensure sufficient joint strength. As described above, the embodiment can achieve greater improvement in the laser joint strength as compared with a case where the resin molded body 1 is formed from an unalloyed crystalline resin. Consequently, the electronic controller 100 can be improved in vibration resistance and impact resistance.

(2) The crystalline resin alloyed with the amorphous resin as the alloying material, namely the polymer alloy has lower elastic modulus in the high temperature region than the unalloyed crystalline resin. Therefore, the polymer alloy can not only afford the above working effects (1) but also reduce shrinkage anisotropy during the injection molding. Hence, the polymer alloy can also make a significant contribution to the improvement in dimensional accuracies of the resin molded body 1.

(3) A crystalline resin and an amorphous resin are selected such that the crystallization speed of a polymer alloy is lower than the crystallization speed of the crystalline resin. Then, the polymer alloy containing these resins is formed. By doing so, the length of time during which the molten resin after the laser irradiation is recrystallized can be made longer than in a case where the unalloyed crystalline resin is used. Thus, the embodiment (e.g. the laser welded body of the third resin piece and the metal piece) can achieve greater improvement in the laser joint strength than the laser welded body including the resin molded body made of the unalloyed crystalline resin and the metal body.

Similarly, a crystalline resin as the base material and a crystalline resin (e.g., PET resin) as the alloying material are selected such that the crystallization speed of the polymer alloy is lower than the crystallization speed of the crystalline resin as the base material. Then, the polymer alloy containing these resins is formed. By doing so, the length of time during which the molten resin after the laser irradiation is recrystallized can be made longer than in a case were the unalloyed crystalline resin is used. Thus, the embodiment (e.g. the laser welded body of the fourth resin piece and the metal piece) can achieve greater improvement in the laser joint strength than the laser welded body including the resin molded body made of the unalloyed crystalline resin and the metal body.

(4) The base material and the alloying material are selected such that the recrystallization temperature Tca of the polymer alloy is lower than the recrystallization temperature Tc of the crystalline resin as the base material of the polymer alloy. Then the polymer alloy containing these materials is formed. By doing so, the length of time during which the molten resin after the laser irradiation is recrystallized can be made longer than in a case where the unalloyed crystalline resin is used. Thus, the embodiment can achieve the greater improvement in the laser joint strength than in the case where the resin molded body 1 is formed from an unalloyed crystalline resin.

(5) The joint strength of the laser weld can be notably improved by giving a treatment (surface modification treatment) for amplifying the oxygen function to the joint surface (resin joint surface 1d) of the resin molded body 1 welded with the metal base 4.

(6) The addition of the glass fiber to the polymer alloy is effective to improve not only the rigidity of the resin molded body 1 but also the long-term dimensional stability thereof.

(7) The electronic controller 100 includes the electronic circuit portion (circuit board 5) received in the accommodation space defined by the metal base 4 and the resin molded body 1. The electronic controller can acquire water proof property, dust resistance and rust resistance because the accommodation space is sealed by laser welding the resin molded body 1 and the metal base 4 together. That is, the embodiment negates the need for sealing the accommodation space by using a liquid adhesive or the like.

In a case where the adhesive is used as a sealing material, the liquid adhesive is excellent in water tightness but has permeability to water vapor and water absorbing property, leading to a fear of corrosion of the metal base 4. In a case where the sealing material is used, the sealing material maybe degraded in sealing performance because of voids included therein. Further, if a large amount of sealing material used for preventing the degradation of sealing performance results in a cost increase.

A thermosetting adhesive is normally used as the sealing material for automotive parts. However, the use of the thermosetting adhesive suffers a drawback of low productivity because the thermosetting adhesive takes more than 10 minutes to be thermally cured. Further, voids are generated by gas generated during heating of the adhesive. This results in another drawback of low yield rate. Another problem is that design freedom is limited because an area for adhesive application needs to be provided in order to control stray adhesive.

In contrast, the embodiment does not encounter the above-described problems because there is no need for using the sealing material. The embodiment is adapted to obviate the increase in manufacturing man-hours and costs and to ensure the water proof property, dust resistance and rust resistance for a longer period of time than the sealing material.

(8) The resin molded body 1 is an integral molded article where the cover 1a for covering the electronic circuit portion (circuit board 5) and the connector 1b retaining the terminal pins to be electrically connected to the electronic circuit portion (circuit board 5) are integrally molded by injection molding. Costs can be reduced by forming the resin molded body 1 in one piece. In a case where the electronic controller is formed by assembling together a plurality of resin parts, the resin joint surface 1d may fail to achieve the flatness due to the influence of assembly tolerances. According to the embodiment, however, the resin molded body 1 is integrally molded, making it easy to achieve required degrees of flatness for laser welding the metal joint surface 4d and the resin joint surface 1d.

Second Embodiment

Figure 11:
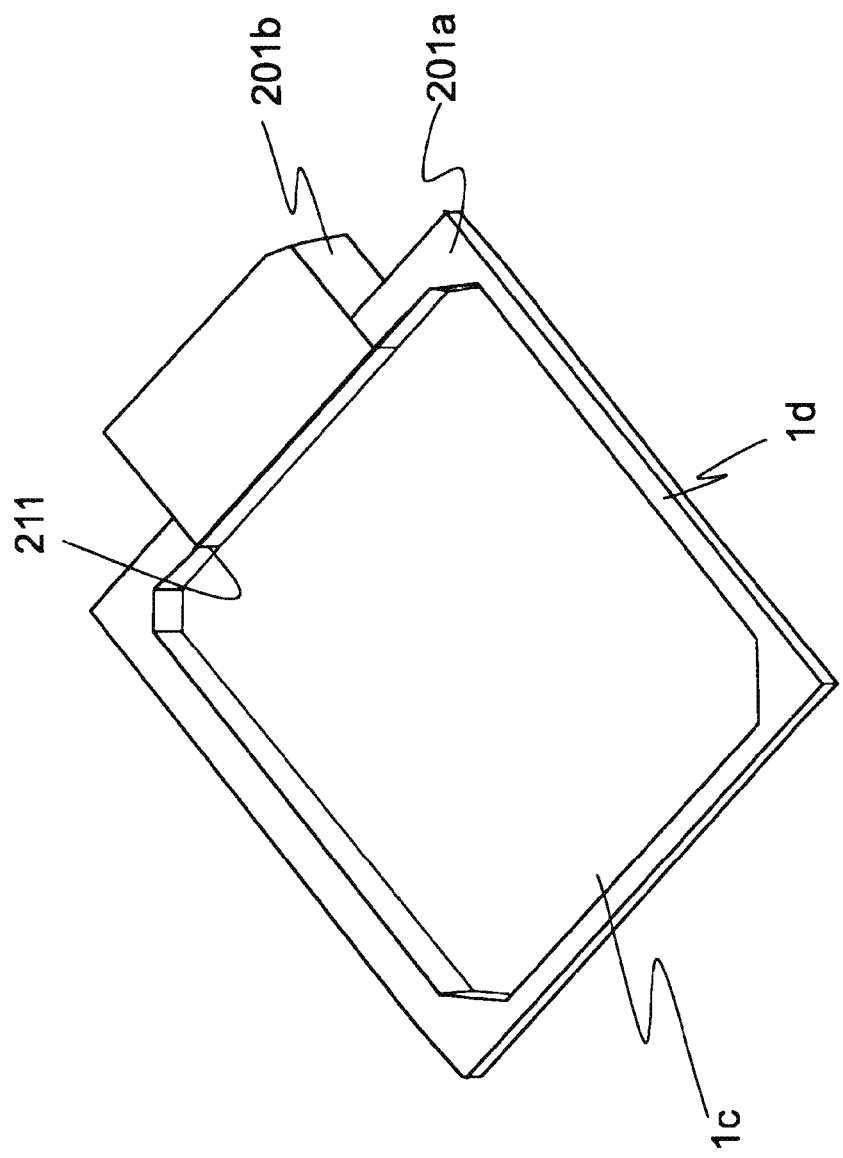
FIG. 11 is a perspective view showing a cover and connector of an electronic controller according to a second embodiment hereof.

An electronic controller according to a second embodiment of the present invention is described with reference to FIG. 11. FIG. 11 is a perspective view showing a cover 201a and a connector 201b of the electronic controller according to the second embodiment hereof. In the figure, like reference characters refer to the same or corresponding components of the first embodiment and the description thereof is dispensed with. A detailed description is made as below on differences from the first embodiment.

According to the first embodiment, the cover 1a and the connector 1b are integrally molded by injection molding. On the other hand, the second embodiment differs from the first embodiment in that the cover 201a for covering the circuit board 5 and the connector 1b for retaining the terminal pins (not shown) are separate components. Namely, the cover 201a and the connector 201b are each formed as the resin molded body made of the polymer alloy as described in the first embodiment.

The connector 201b is inserted in a cutout portion 211 of the cover 201a and welded to the cover. Any of various welding methods including laser welding, ultrasonic welding, hot plate welding and the like is adoptable. It is noted that the connector 201b and the cover 201a may be coupled to each other by means of an adhesive or a snap-fit instead of welding.

The second embodiment affords the following working effects in addition to the working effects 1 to 8 described in the first embodiment.

(9) Since the cover 201a and the connector 201b are separate members (discrete parts), the cover 201a and the connector 201b can be formed from different materials, respectively. For example, the connector 201b having a high requirement for flame resistance (in terms of grade or environmental regulation) can adopt a material incorporating a larger amount of flame retardant than the material of the cover 201a. Thus, the material costs for the cover and connector can be reduced as compared with a case where the cover and connector are integrally formed while meeting the requirement for flame resistance.

In a case where the connector 201b is more enhanced in the flame resistance than the cover 201a, the polymer alloy constituting the cover 201a may contain a different alloying material from that contained in the polymer alloy constituting the connector 201b. In a case where the cover 201a and the connector 201b are welded together and the PBT resin is selected as the respective base materials for the cover 201a and the connector 201b, it is known that if the connector 201b incorporates a large amount of flame retardant, the flame retardant does not exert a significant influence on the weldability of these components.

(10) Since the cover 201a and the connector 201b can be made of different materials, the cover 201a and the connector 201b can be formed in different colors. For example, a black resin is used for forming the connector 201b while a natural-colored resin is used for the cover 201a. Using the natural-colored resin, or a natural material free from a coloring additive facilitates an appearance inspection. If the cover 201a has a thickness of 1.0 to 1.5 mm, the cover has a relatively high light transmittance so as to facilitate the inspection of welded state.

The following modifications are also included in the scope of the present invention and one or more of the modifications can be combined with the above-described embodiments.

First Modification

Figure 12:
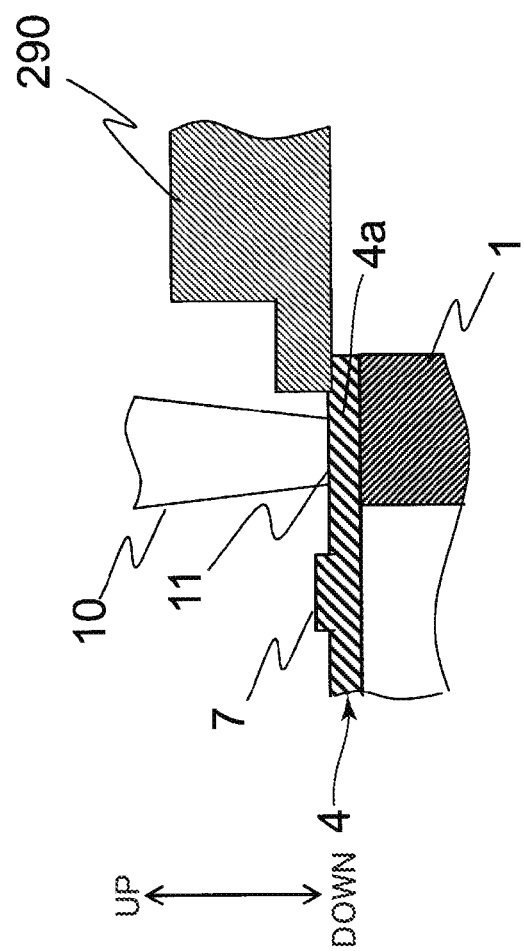
FIG. 12 is a sectional view illustrating a laser welding method for an electronic controller according to a first modification and a second modification.

While the above embodiments are described by way of examples where the metal base 4 is pressed by the pressure jig 190 placed centrally thereof, the present invention is not limited to this. As shown in FIG. 12, for example, the metal base 4 may be pressed by a pressure jig 290 placed on an outside end of the metal base 4, or at an area outside the laser irradiation face 11.

Second Modification

In the above embodiments, the metal base 4 is scanned on the whole outside circumference thereof by the first laser irradiation step S154 of linearly scanning the laser beam 10, followed by the second laser irradiation step S158 of scanning the laser beam 10 on the open-ended rectangular trajectory (see FIG. 6). Namely, the description is made on the example where the process of scanning the whole outside circumference of the laser irradiation face 11 of the metal base 4 is divided in two steps, but the present invention is not limited to this. The laser beam 10 may be scanned on the whole outside circumference of the laser irradiation face in one step.

As shown in FIG. 12, for example, a method may be adopted where the metal base 4 is irradiated with the laser beam 10 from a laser apparatus equipped with a galvanoscanner while the metal base 4 is pressed against the resin molded body 1 by means of the pressure jigs 290 placed on the outside ends of the metal base that correspond to the four sides of the metal base 4. In this method, the laser beam 10 can be scanned on the whole circumference of the metal base without dividing the process. With a mirror of the galvanoscanner positioned directly above the center of the metal base 4, the laser apparatus can scan the laser beam 10 on a trajectory defining a blank rectangle shape. The laser apparatus equipped with the galvanoscanner is suitable for fabricating an electronic controller of a comparatively small size.

Third Modification

Figure 13:
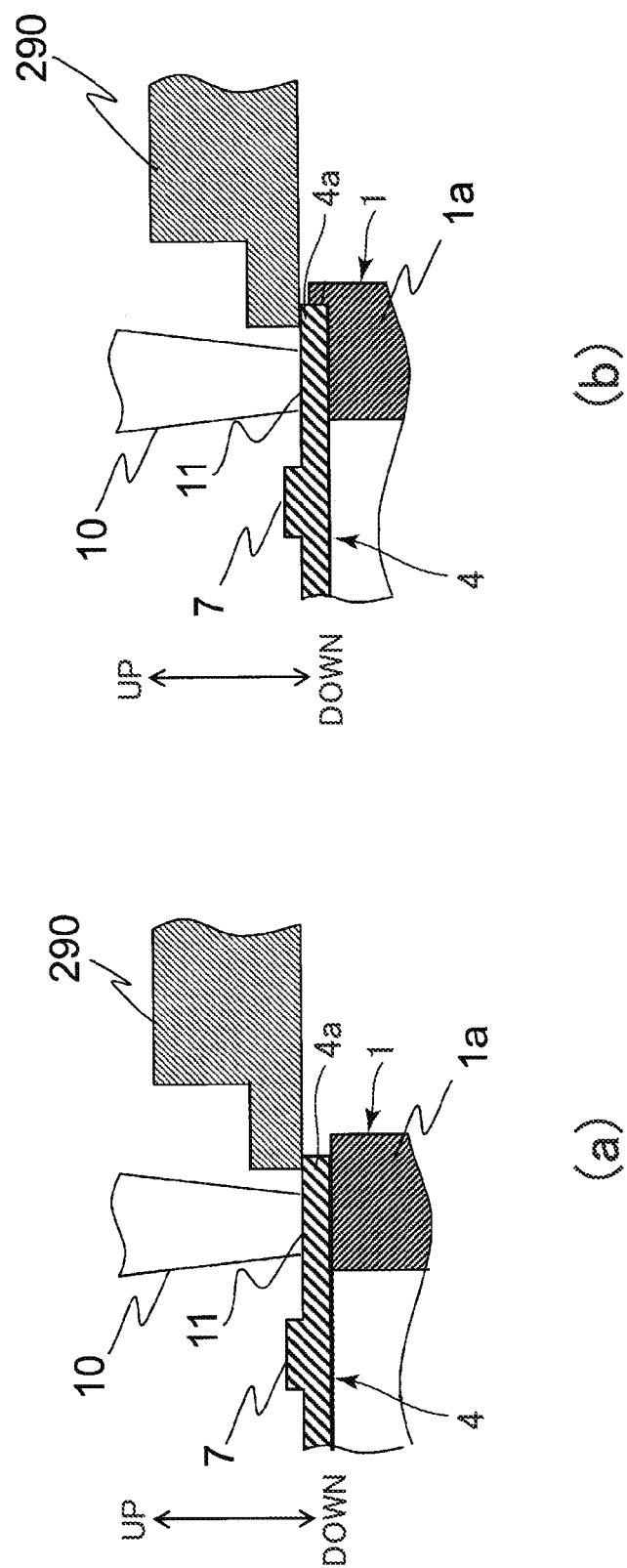
FIG. 13 is a set of sectional views illustrating a laser welding method for an electronic controller according of a third modification.

As shown in FIG. 13(a), the metal base 4 may be made one size smaller than the cover 1a of the resin molded body 1. In this case, an abrupt drop of elastic modulus (see FIG. 10) is induced by irradiating the laser irradiation face 11 with the laser beam 10 and heating the resin molded body 1 via the metal base 4. Hence, the amount of gap between the resin molded body 1 and the metal base 4 can be reduced before the temperature reaches the melting point Tm of the resin molded body 1 so that the resin molded body 1 and the metal base 4 can be made to adhere tightly to each other. Further, when the temperature exceeds the melting point Tm of the resin molded body 1, the outside circumference of the metal base 4 is embedded in the resin molded body 1, as shown in FIG. 13(b). A preferred embedment depth of the metal base 4 is a half or more of the thickness of the metal base 4. This leads to a longer a leak path, and further improved water proof property, dust resistance and rust resistance.

In the case where the outside circumference (connection portion 4a) of the metal base 4 is embedded in the resin molded body 1, whether or not the laser welding is done properly or whether or not the welded body suffers separation can be determined by taking measurement of the amount of embedment.

In the case of the PBT resin (non-alloy), on the other hand, the abrupt drop of elastic modulus (see FIG. 10) is not induced. This makes it difficult to embed the whole outside circumference of the metal base 4 in the resin molded body. Hence, the resin body and the metal base are lowered in adhesion. In a case where the surface modification treatment is given to the PBT resin (non-alloy), therefore, the effect of surface modification is significantly reduced due to the thermal decomposition of the surface modified PBT resin at an area where the resin is not adhered to the metal base. From the viewpoint of improving gap robustness and improving weldability and reliability by embedment, it is quite effective to add to the PBT resin an amorphous resin of low glass transition temperature as the alloying material.

Fourth Modification

As shown in FIG. 14(a), the outside circumference of the metal base 4 may be formed with a protrusion 21 protruded toward the resin molded body 1. A top surface of the protrusion 21 may be pressed against the resin molded body 1. This permits the reduction of pressure required of the pressure jig 290 so that a required amount of embedment can be easily achieved, as shown in FIG. 14(b). Further, resin burrs produced in the pressure step can be prevented from extending outward.

Fifth Modification

As shown in FIG. 14, the metal base 4 may be formed with a groove 22 between a cooling fin 7 and the laser irradiation face 11 thereof. This configuration enables laser welding with less energy because the leakage of heat generated by the laser irradiation to place other than the welded portion is reduced. However, the depth of the groove 22 must be designed in consideration of rigidity because the metal base 4 is prone to warping due to rigidity degradation.

Sixth Modification

In the pressure Steps (S152, A156), the pressure jig 190, 290 may be heated by a heater or the like, and the metal base 4 is pressured by the heated pressure jig. In this case, the amount of embedment can be increased by heating the resin molded body 1 to above the glass transition temperature Tg of the alloying material, as compared with a case where the resin molded body 1 is not heated. It is also preferred to perform the laser welding in a state where the resin molded body 1 is heated to a temperature which equal to or more than the recrystallization temperature of the polymer alloy and is equal to or less than the melting start temperature of the polymer alloy. This makes the crystallization proceed slowly after the laser welding while rapid resin cooling can also be suppressed. Hence, the resin is also reduced in thermal stress. There is another advantage that the laser energy required for laser welding can be drastically reduced.

Seventh Modification

The pressure jig 190, 290 may be provided with a glass plate which is transparent to the laser beam 10 and has high transmittance and heat resistance. The laser beam 10 may be emitted to the laser irradiation face 11 via the glass plate.

Eighth Modification

While the above embodiments are described by way of example where the metal base 4 is provided with the laser irradiation face 11 and irradiated with the laser beam 10, the present invention is not limited to this. In the case of the resin molded body 1 having high transmittance, the laser welding may be accomplished by irradiating the resin molded body 1 with the laser beam 10.

Ninth Modification

In the above embodiments, the metal base 4 may be formed from a variety of metals such as stainless steel in place of the above-described die-cast aluminum, JIS A5052, and galvanized steel sheet.

Tenth Modification

While the above embodiments are described by way of example where the atmospheric pressure plasma treatment is performed as a treatment to generate and amplify the oxygen function on the resin and a treatment to clean the metal surface and to form the robust oxide film thereon, the present invention is not limited to this. The atmospheric pressure plasma treatment may be replaced by a low-pressure plasma treatment. It is noted that the atmospheric pressure plasma treatment is more effective than the low-pressure Plasma treatment in terms of productivity, while the low-pressure plasma treatment is effective in that a variety of gasses can be imparted. Further, the plasma treatment may be replaced by, for example, a dry treatment by irradiation of UV ozone, excimer laser, short pulses or the like.

Eleventh Modification

It is preferred to give the surface modification treatment to at least the resin joint surface 1d of the resin molded body 1. It is further preferred to further give the surface modification treatment to the metal joint surface 4d of the metal base 4. A significant effect can be attained by giving the treatment to only one of the resin side and the metal side.

Twelfth Modification

In the above embodiments, the description is made on the strength evaluation of the laser welded body employing the resin piece TPp where a content percentage of the amorphous resin in the polymer alloy is in the range of 20 to 30%, but the present invention is not limited to this. If the content percentage of the amorphous resin in the polymer alloy is less than 5%, the effect to improve the joint strength is small. It is therefore preferred that the content percentage of the amorphous resin in the polymer alloy is 5% or more.

If the content percentage of the amorphous resin in the polymer alloy exceeds 40%, the characteristics of the amorphous resin become prominent and the welded body may be degraded in heat resistance. It is therefore preferred that the content percentage of the amorphous resin in the polymer alloy is 40% or less. If the content percentage of the amorphous resin in the polymer alloy is 40% or less, the welded body is not significantly degraded in reliability when subjected to a long-term high-temperature exposure test at 150° C., ensuring an adequate heat resistance.

Thirteenth Modification

In the above embodiments, the description is made on strength evaluation of the laser welded body employing the resin piece TPp where a mixing ratio of the glass fiber in the polymer alloy is in the range of 30 to 40 wt %, but the present invention is not limited to this. If the mixing ratio of the glass fiber in the polymer alloy is less than 20 wt %, the effect to improve the rigidity is small. It is therefore preferred that the mixing ratio of the glass fiber in the polymer alloy is 20 wt % or more. If the mixing ratio of the glass fiber in the polymer alloy exceeds 50 wt %, the polymer alloy may be degraded in moldability. It is therefore preferred that the mixing ratio of the glass fiber is 50 wt % or less.

Fourteenth Modification

While the above embodiments are described by way of example where the glass fiber is added to the polymer alloy, the present invention is not limited to this. Any of inorganic fillers made of an inorganic substance can be added to the polymer alloy to improve the rigidity of the polymer alloy. For example, glass flakes or specially shaped glass pieces may be added in place of the glass fiber. Further, carbon fiber can be added in place of the glass fiber. This is effective to improve the polymer alloy not only in the rigidity but also in electromagnetic shielding property. A conductive carbon (e.g., Ketchen black, acetylene black, carbon beads, graphite and the like) is usable as the inorganic filler for improving the electromagnetic shielding property. It is noted that a case where the inorganic filler is not added to the polymer alloy is also included in the scope of the present invention.

Fifteenth Modification

While the above embodiments are described with regard to the strength evaluation of the laser welded bodies including the metal piece TPm having a surface roughness Ra of 0.3 μm at the joint surface with the resin piece TPp and the metal piece TPm having a surface roughness Ra of 2.0 μm at the joint surface with the resin piece TPp, the present invention is not limited to this. If the surface roughness Ra at the joint surface of the metal piece TPm is less than 0.1 μm, the effect to improve the joint strength is so small that the welded body is prone to separation. Therefore, it is preferred that the surface roughness Ra at the joint surface of the metal piece TPm is 0.1 μm or more. Even if the surface roughness Ra is less than 0.1 μm, the resin piece TPp and the metal piece TPm can be welded together by giving the plasma treatment to these pieces prior to the laser welding.

If the surface roughness Ra at the joint surface of the metal piece TPm exceeds 7.0 μm, the resin is not fully filled in the rough surface so that the welded body is degraded in the joint strength. Therefore, it is preferred that the surface roughness Ra at the joint surface of the metal piece TPm is 7.0 μm or less, and more preferably 5.0 μm or less from the viewpoint of airtightness.

Sixteenth Modification

The polymer alloy as the material of the resin molded body 1 may be added with a variety of additives which include: stabilizers such as antioxidant, ultraviolet absorber, thermal stabilizer and antistatic agent; nucleating agent; plasticizer; lubricant; and the like. The additive is preferably added in such an amount as not to impair the effect to enhance the joint strength.

The PBT resin is characterized by being susceptible to hydrolysis. In a case where the polymer alloy is based on the PBT resin, therefore, it is preferred to add a hydrolysis inhibitor (e.g., an epoxy resin). In a case where an ester-containing PC alloy or PET alloy is used, the PC alloy or PET alloy is as much susceptible to hydrolysis as PBT and hence, is preferably added with the hydrolysis inhibitor. Further, the use of the ester-containing PC alloy or PET alloy involves fear that excess transesterification reaction may result in the decrease in productivity or the degradation in physical properties of a molded body. Hence, it is also effective to add a transesterification terminator (e.g., phosphorous compound) to the ester-containing PC alloy or PET alloy. To meet demand for flame resistance property, a flame retardant (e.g., phosphorous retardant, bromic retardant) may be added.

Seventeenth Modification

While the above embodiments are described by way of example where the metal base 4 is formed in the rectangular plate-like configuration and the recess 1c is formed in the resin molded body 1, the present invention is not limited to this. For example, the metal base 4 may be formed with a recess for receiving the circuit board 5 while the resin molded body 1 may be formed in a plate-like configuration.

Eighteenth Modification

While the second embodiment is described by way of example where the cover 201*a* and the connector 201*b* are united together by welding or the like, the present invention is not limited to this. The cover 201*a* and the connector 201*b* do not need to be united together. In this case, each of the cover 201*a* and the connector 201*b* is laser welded to the metal base 4. Alternatively, one of the cover 201*a* and the connector 201*b* may be laser welded to the metal base 4 and the other may be bonded to the metal base 4 with an adhesive or the like. Even in the case of the combined use of the laser welding and the adhesive, the usage of the adhesive can be reduced as compared with a case where all the components are bonded with the adhesive.

Nineteenth Modification

While the above embodiments are described by way of example where the present invention is applied to the electronic controller 100 as the engine controller unit installed in the automobile, the present invention is not limited to this. The present invention is applicable to a variety of parts formed by laser welding the resin molded body and the metal body.

Twentieth Modification

The alloyed resin only needs to define at least a portion corresponding to the laser welded portion 11*a*. In the first embodiment, for example, only an outer peripheral portion of the cover la may be formed of a member molded from an alloyed resin while a central portion of the cover 1*a* maybe formed of a member molded from an unalloyed resin. These members are bonded together by welding.

Twenty-first Modification

The above-described manufacture method for the electronic controller 100 is intended for purposes of illustration only and the electronic controller 100 can be fabricated using a variety of manufacture methods. In the above embodiment, for example, the description is given on the example where the assembly step S140 includes: placing and fixing the circuit board 5 in and to the recess 1*c* of the resin molded body 1; followed by welding the metal base 4 to the resin molded body 1. However, the present invention is not limited to this. The assembly step maybe performed by: placing and fixing the circuit board 5 in and to the metal base 4; and welding the resin molded body 1 to the metal base 4.

Twenty-second Modification

While the above embodiments are described by way of example where the maximum gap amount between the resin piece TPp and the metal piece TPm is on the order of 20 μm, the present invention is not limited to this. It is desirable to reduce the gap amount as much as possible because the joint strength decreases with increase in the gap amount between the resin piece TPp and the metal piece TPm. With a gap amount more than 100 μm, the resin piece TPp and the metal piece TPm cannot be welded together. Therefore, the gap amount must be limited to 100 μm or less. In the case of a gap amount of 50 μm or more and 100 μm or less, the laser welded portion 11*a* contains many voids therein due to the thermal decomposition of the resin piece TPp, which makes it difficult to maintain the joint strength over a long period of time. Therefore, it is preferred to minimize the gap amount by maintaining the resin piece TPp in pressure contact with the metal piece TPm. A preferred gap amount is 50 μm or less.

It is noted that the present invention should not be limited to the forgoing embodiments as long as the features of the present invention are not impaired, and other modes conceivable in the scope of technical idea of the present invention are construed as being included therein.

The present application claims priority from Japanese patent application JP2014-209352 filed on Oct. 10, 2014, the content of which is hereby incorporated by reference into this application.

LIST OF REFERENCE SIGNS

1: resin molded body
1*a*: cover
1*b*: connector
1*c*: recess
1*d*: resin joint surface
4: metal base
4*a*: connection portion
4*d*: metal joint surface
5: circuit board
6: electronic component
7: cooling fin
10: laser beam
11: laser irradiation face
11*a*: laser welded portion
21: protrusion
22: groove
100: electronic controller
190: pressure jig
201*a*: cover
201*b*: connector
204: input/output port
205: input circuit
206: ignition output circuit
207: injection valve drive circuit
208: spark plug
209: fuel injection valve
211: cutout portion
290: pressure jig

The invention claimed is:

1. A laser welded structure comprising a resin molded body and a metal body made of a metal which are laser welded together, the resin molded body formed from a thermoplastic polymer alloy containing a crystalline resin and an amorphous resin,
   wherein a glass transition temperature of the amorphous resin is lower than a melting start temperature of the crystalline resin,
   wherein at least a joint surface of the resin molded body with the metal body is subjected to an oxygen function amplifying treatment.

2. A laser welded structure comprising a resin molded body and a metal body made of a metal which are laser welded together, the resin molded body formed from a thermoplastic polymer alloy containing a crystalline resin and another resin,
   wherein a crystallization speed of the polymer alloy is lower than a crystallization speed of the crystalline resin, or a recrystallization temperature of the polymer alloy is lower than a recrystallization temperature of the crystalline resin,
   wherein at least a joint surface of the resin molded body with the metal body is subjected to an oxygen function amplifying treatment.

3. The laser welded structure according to claim 1,
   wherein a crystallization speed of the polymer alloy is lower than a crystallization speed of the crystalline resin, or a recrystallization temperature of the polymer alloy is lower than a recrystallization temperature of the crystalline resin.

4. The laser welded structure according to claim 1, wherein the polymer alloy contains a copolymer of the crystalline resin.

5. The laser welded structure according to claim 1, wherein a content percentage of the amorphous resin in the polymer alloy is 5 to 40%.

6. The laser welded structure according to claim 1, wherein an inorganic filler is added to the polymer alloy.

7. The laser welded structure according to claim 1, wherein a joint surface of the metal body with the resin molded body has a surface roughness Ra of 0.1 μm to 5.0 μm.

8. The laser welded structure according to claim 1, wherein at least a part of the metal body is embedded in the resin molded body.

9. An electronic controller including the laser welded structure according to claim 1,
the electronic controller comprising an electronic circuit portion received in an accommodation space defined by the metal body and the resin molded body,
wherein the accommodation space is sealed by laser welding the resin molded body and the metal body.

10. The electronic controller according to claim 9, wherein the resin molded body is an integral molded body formed by integrally molding a cover for covering the electronic circuit portion, and a connector retaining terminals to be electrically connected to the electronic circuit portion.

11. The electronic controller according to claim 9, comprising:
a cover for covering the electronic circuit portion; and a connector separate from the cover and retaining terminals to be electrically connected to the electronic circuit portion,
wherein the cover and the connector are each composed of the resin molded body and are united with each other.

12. A manufacture method for laser welded structure comprising:
preparing a resin molded body made of a thermoplastic polymer alloy containing a crystalline resin and an amorphous resin, and a metal body made of a metal;
the amorphous resin having a glass transition temperature lower than a melting start temperature of the crystalline resin;
giving an oxygen function amplifying treatment to at least a portion of the resin molded body that is laser welded to the metal body;
heating the resin molded body to a temperature to or above the glass transition temperature of the amorphous resin; and
laser welding the resin molded body and the metal body together in a state where the resin molded body is in pressure contact with the metal body.

13. The manufacture method for laser welded structure according to claim 12,
wherein the resin molded body and the metal body are laser welded together in a state where the resin molded body is heated to a temperature equal to or higher than a recrystallization temperature of the polymer alloy and equal to or lower than a melting start temperature of the polymer alloy.

* * * * *